United States Patent
Li et al.

(10) Patent No.: US 12,148,598 B2
(45) Date of Patent: Nov. 19, 2024

(54) PLASMA PROCESSING APPARATUS

(71) Applicant: Tokyo Electron Limited, Tokyo (JP)

(72) Inventors: Lifu Li, Miyagi (JP); Takaki Kobune, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 320 days.

(21) Appl. No.: 17/666,871

(22) Filed: Feb. 8, 2022

(65) Prior Publication Data

US 2022/0254611 A1 Aug. 11, 2022

(30) Foreign Application Priority Data

Feb. 10, 2021 (JP) ................. 2021-020071

(51) Int. Cl.
*H01J 37/32* (2006.01)
*G05D 3/00* (2006.01)
*H05B 1/02* (2006.01)

(52) U.S. Cl.
CPC .......... *H01J 37/32522* (2013.01); *G05D 3/00* (2013.01); *H01J 37/32568* (2013.01); *H05B 1/023* (2013.01); *H01J 2237/334* (2013.01)

(58) Field of Classification Search
CPC ............................................... H01J 37/32522
See application file for complete search history.

(56) References Cited

U.S. PATENT DOCUMENTS

| | | | | |
|---|---|---|---|---|
| 3,699,384 A * | 10/1972 | Eckhardt | ................. | H01J 13/04 313/170 |
| 6,091,316 A * | 7/2000 | Hofsass | ................. | H01H 81/02 337/365 |
| 2008/0129228 A1* | 6/2008 | Florian | ................. | H05B 41/08 315/209 M |
| 2011/0214815 A1* | 9/2011 | Koshiishi | .......... | H01J 37/32706 156/345.38 |
| 2013/0199646 A1 | 8/2013 | Brammer et al. | | |

FOREIGN PATENT DOCUMENTS

JP 2019-536268 A 12/2019
JP 2020-109838 A 7/2020

* cited by examiner

*Primary Examiner* — Keath T Chen
(74) *Attorney, Agent, or Firm* — Nath, Goldberg & Meyer; Jerald L. Meyer; Tanya E. Harkins

(57) ABSTRACT

A plasma processing apparatus includes: a plasma processing chamber; a first conductive member disposed in the plasma processing chamber and having a first surface; a second conductive member having a second surface facing the first surface of the first conductive member; a third member disposed on at least one selected from the group of the first conductive member and the second conductive member and having a shape that varies according to a temperature change of the third member; and a control mechanism configured to change a temperature of the third member.

11 Claims, 4 Drawing Sheets

PLASMA PROCESSING APPARATUS

CROSS-REFERENCE TO RELATED APPLICATION

This application is based upon and claims the benefit of priority from Japanese Patent Application No. 2021-020071, filed on Feb. 10, 2021, the entire contents of which are incorporated herein by reference.

TECHNICAL FIELD

The present disclosure relates to a plasma processing apparatus.

BACKGROUND

There is known a plasma processing apparatus in which a voltage or current is applied to an upper electrode.

Patent Document 1 discloses a plasma processing apparatus that includes an electrode support made of a conductive material, an electrode plate made of silicon or SiC, and an upper electrode supported on an upper portion of a processing container via an insulating shield.

PRIOR ART DOCUMENT

Patent Document

Patent Document 1: Japanese Laid-Open Patent Publication No. 2020-109838

However, in the plasma processing apparatus that applies a voltage or current to a conductive member such as the electrode support disclosed in Patent Document 1, a configuration of the conductive member is required to be replaced when switching between a state (floating state) in which the conductive member floats from a ground voltage at the time of applying the voltage or current and a state (GND state) in which the conductive member has a ground voltage.

SUMMARY

According to an aspect of the present disclosure, there is provided a plasma processing apparatus including: a plasma processing chamber; a first conductive member disposed in the plasma processing chamber and having a first surface; a second conductive member having a second surface facing the first surface of the first conductive member; a third member disposed on at least one selected from the group of the first conductive member and the second conductive member and having a shape that varies according to a temperature change of the third member; and a control mechanism configured to change a temperature of the third member.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
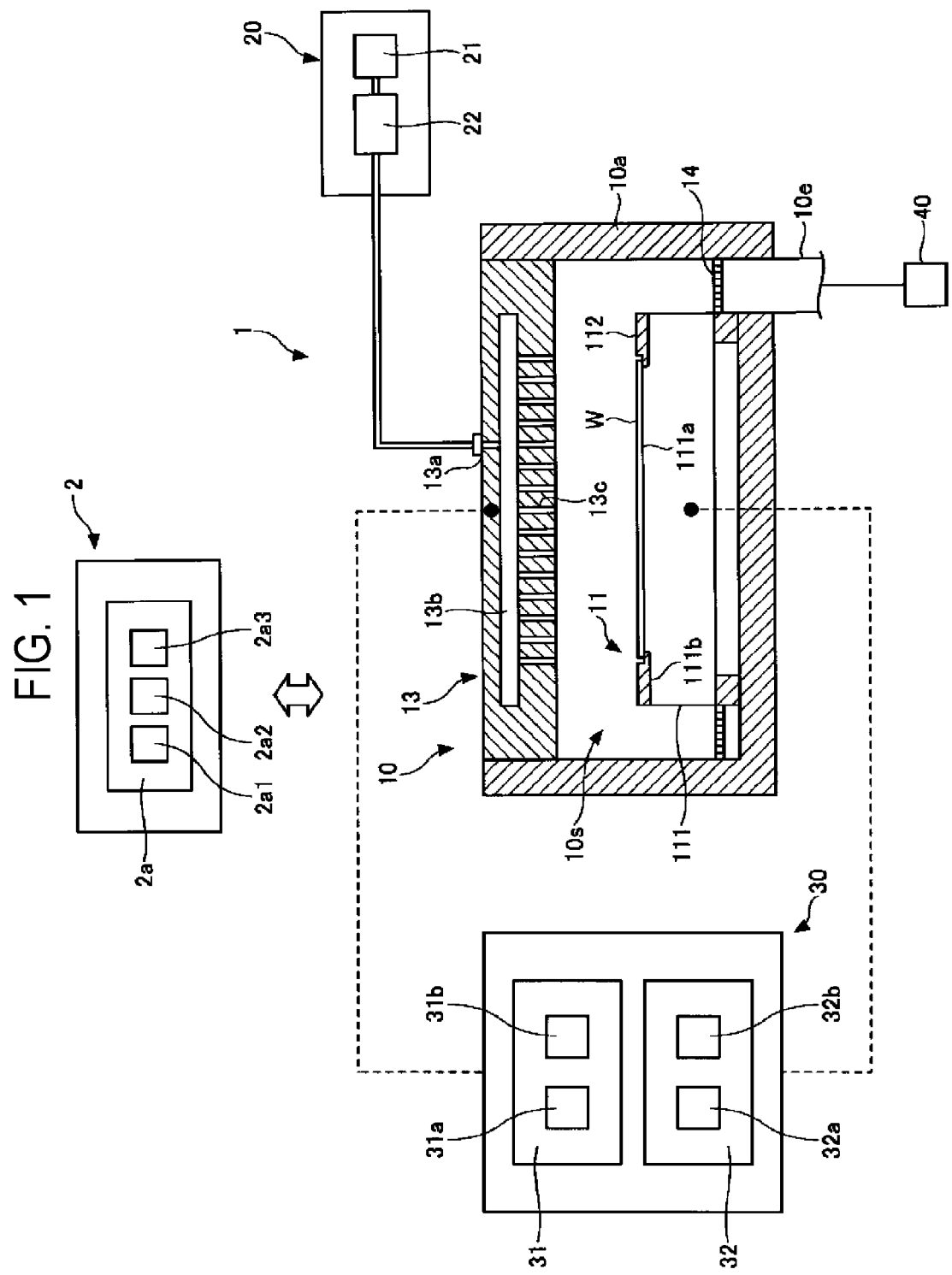
FIG. 1 is a diagram showing a configuration example of a plasma processing system according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments for carrying out the present disclosure will be described with reference to the drawings. In each drawing, the same components may be designated by like reference numerals and the duplicate explanations thereof may be omitted.

A configuration example of a plasma processing system will be described below. FIG. 1 is a diagram showing a configuration example of a plasma processing system according to an embodiment.

The plasma processing system includes a capacitively coupled plasma processing apparatus 1 and a controller 2. The capacitively coupled plasma processing apparatus 1 includes a plasma processing chamber 10, a gas supply 20, a power supply 30, and an exhaust system 40. Further, the plasma processing apparatus 1 includes a substrate support 11 and a gas introducer. The gas introducer is configured to introduce at least one processing gas into the plasma processing chamber 10. The gas introducer includes a shower head 13 (also referred to as an upper electrode). The substrate support 11 is disposed inside the plasma processing chamber 10. The shower head 13 is disposed above the substrate support 11. In one embodiment, the shower head 13 constitutes at least a portion of a ceiling of the plasma processing chamber 10. The plasma processing chamber 10 has a plasma processing space 10s defined by the shower head 13, a side wall 10a of the plasma processing chamber 10, and the substrate support 11. The plasma processing chamber 10 has at least one gas supply port for supplying at least one processing gas to the plasma processing space 10s, and at least one gas discharge port 10e for discharging the gas from the plasma processing space 10s. The side wall 10a is grounded. The shower head 13 and the substrate support 11 are electrically insulated from a housing of the plasma processing chamber 10.

The substrate support 11 includes a main body portion 111 and a ring assembly 112. The main body portion 111 has a central region (substrate support surface) 111a for supporting a substrate (wafer) W and an annular region (ring support surface) 111b for supporting the ring assembly 112. The annular region 111b of the main body portion 111 surrounds the central region 111a of the main body portion 111 in a plan view. The substrate W is disposed on the central region 111a of the main body portion 111, and the ring assembly 112 is disposed on the annular region 111b of the main body portion 111 to surround the substrate W on the central region 111a of the main body portion 111. In one embodiment, the main body portion 111 includes a base and an electrostatic chuck. The base includes a conductive member. The conductive member of the base functions as a lower electrode. The electrostatic chuck is disposed on the base. An upper surface of the electrostatic chuck has the substrate support surface 111a. The ring assembly 112 includes one or more annular members. At least one of the one or more annular members is an edge ring. Although not shown, the substrate support 11 may include a temperature control module configured to adjust a temperature of at least one of the electrostatic chuck, the ring assembly 112, and the substrate W to a target temperature. The temperature control module may include a heater, a heat transfer medium, a flow path, or a combination thereof. A heat transfer fluid such as brine or a gas flows through the flow path. Further, the substrate support 11 may include a heat transfer gas supply configured to supply a heat transfer gas between a back surface of the substrate W and the substrate support surface 111a.

The shower head 13 is configured to introduce at least one processing gas from the gas supply 20 into the plasma processing space 10s. The shower head 13 has at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the plurality of gas introduction ports 13c. Further, the shower head 13 includes a conductive member. The conductive member of the shower head 13 functions as an upper electrode. The gas introducer may include, in addition to the shower head 13, one or more side gas injectors (SGIs: Side Gas Injectors) installed at one or more openings formed on the side wall 10a.

The gas supply 20 may include at least one gas source 21 and at least one flow rate controller 22. In one embodiment, the gas supply 20 is configured to supply at least one processing gas from a corresponding gas source 21 to the shower head 13 via a corresponding flow rate controller 22. Each flow rate controller 22 may include, for example, a mass flow controller or a pressure-controlled flow rate controller. Further, the gas supply 20 may include one or more flow rate modulation devices that modulate or pulse the flow rate of at least one processing gas.

The power supply 30 includes an RF power supply 31 coupled to the plasma processing chamber 10 via at least one impedance matching circuit. The RF power supply 31 is configured to supply at least one RF signal (RF power) such as a source RF signal or a bias RF signal to the conductive member of the substrate support 11 and/or the conductive member of the shower head 13. As a result, plasma is formed from at least one processing gas supplied to the plasma processing space 10s. Thus, the RF power supply 31 may function as at least a part of a plasma generator configured to generate plasma from one or more processing gases in the plasma processing chamber 10. Further, by supplying the bias RF signal to the conductive member of the substrate support 11, a bias potential is generated in the substrate W so that ionic components in the formed plasma can be drawn into the substrate W.

In one embodiment, the RF power supply 31 includes a first RF generator 31a and a second RF generator 31b. The first RF generator 31a is coupled to the conductive member of the substrate support 11 and/or the conductive member of the shower head 13 via at least one impedance matching circuit and is configured to generate the source RF signal (source RF power) for plasma generation. In one embodiment, the source RF signal has a frequency in the range of 13 MHz to 150 MHz. In one embodiment, the first RF generator 31a may be configured to generate multiple source RF signals with different frequencies. The one or more source RF signals thus generated are supplied to the conductive member of the substrate support 11 and/or the conductive member of the shower head 13. The second RF generator 31b is coupled to the conductive member of the substrate support 11 via at least one impedance matching circuit and is configured to generate the bias RF signal (bias RF power). In one embodiment, the bias RF signal has a lower frequency than the source RF signal. In one embodiment, the bias RF signal has a frequency in the range of 400 kHz to 13.56 MHz. In one embodiment, the second RF generator 31b may be configured to generate multiple bias RF signals with different frequencies. The bias RF signal thus generated is supplied to the conductive member of the substrate support 11. In various embodiments, at least one of the source RF signal and the bias RF signal may be pulsed.

Further, the power supply 30 may include a DC power supply 32 coupled to the plasma processing chamber 10. The DC power supply 32 includes a first DC generator 32a and a second DC generator 32b. In one embodiment, the first DC generator 32a is connected to the conductive member of the substrate support 11 and is configured to generate a first DC signal. The first DC signal thus generated is applied to the conductive member of the substrate support 11. In one embodiment, the first DC signal may be applied to another electrode such as the electrode in the electrostatic chuck. In one embodiment, the second DC generator 32b is connected to the conductive member of the shower head 13 and is configured to generate a second DC signal. The second DC signal thus generated is applied to the conductive member of the shower head 13. In various embodiments, at least one of the first and second DC signals may be pulsed. The first and second DC generators 32a and 32b may be provided in addition to the RF power supply 31, or the first DC generator 32a may be provided in place of the second RF generator 31b.

The exhaust system 40 may be connected to, for example, the gas discharge port 10e provided at a bottom of the plasma processing chamber 10. The exhaust system 40 may include a pressure regulation valve and a vacuum pump. The pressure regulation valve regulates a pressure in the plasma processing space 10s. The vacuum pump may include a turbo molecular pump, a dry pump, or a combination thereof. Further, the plasma processing apparatus 1 includes a baffle plate 14. The baffle plate 14 is provided between the side wall 10a and the substrate support 11 and configured to adjust a gas flow from the plasma processing space 10s to the gas discharge port 10e.

The controller 2 processes computer-executable instructions that cause the plasma processing apparatus 1 to perform various processes described in the present disclosure. The controller 2 may be configured to control individual components of the plasma processing apparatus 1 to perform the various processes described herein. In one embodiment, a part or the entirety of the controller 2 may be included in the plasma processing apparatus 1. The controller 2 may include, for example, a computer 2a. The computer 2a may include, for example, a processor (CPU: Central Processing Unit) 2a1, a memory 2a2, and a communication interface 2a3. The processor 2a1 may be configured to perform various control operations based on a program stored in the memory 2a2. The memory 2a2 may include a random access memory (RAM), a read only memory (ROM), a hard disk drive (HDD), a solid state drive (SSD), or a combination thereof that are computer readable. The communication interface 2a3 may communicate with the plasma processing apparatus 1 via a communication line such as a local area network (LAN) or the like.

Figure 2:
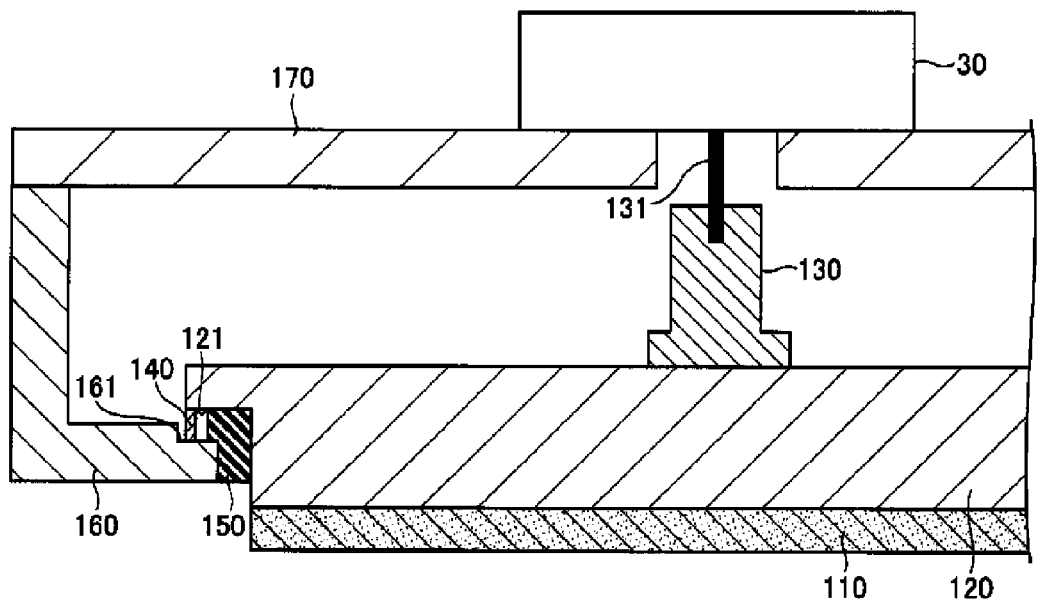
FIG. 2 shows an example of an upper electrode according to a first embodiment when a DC is not applied.
Figure 3:
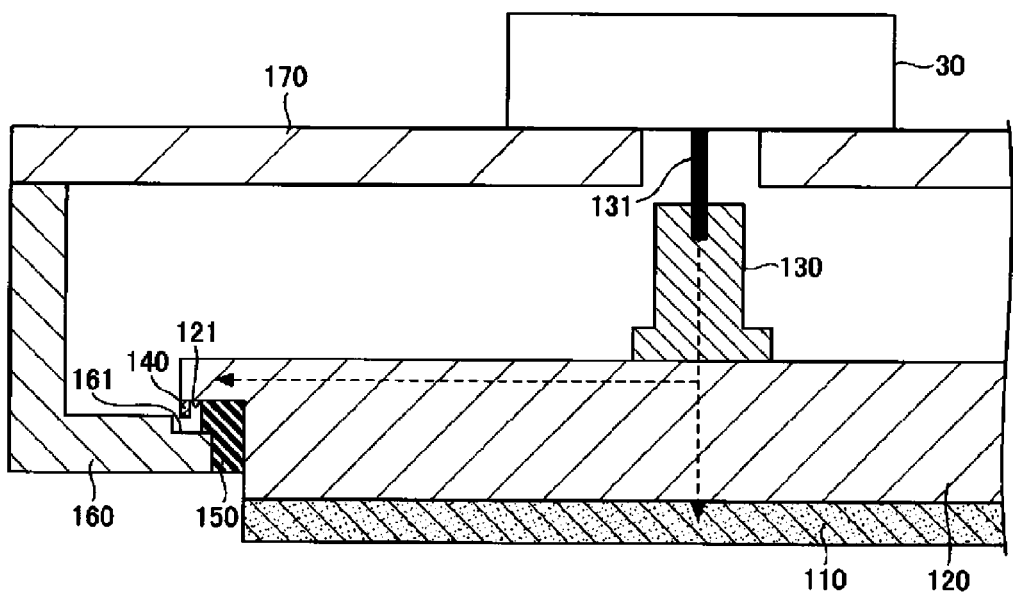
FIG. 3 shows an example of the upper electrode according to the first embodiment when the DC is applied.

Next, an example of the upper electrode (shower head 13) of the plasma processing apparatus 1 will be further described with reference to FIGS. 2 and 3. FIG. 2 is an example of the upper electrode of the first embodiment when a DC is not applied. FIG. 3 is an example of the upper electrode of the first embodiment when a DC is applied. In FIG. 3, the applied voltage or current is schematically indicated by a broken line.

The plasma processing apparatus 1 includes an electrode plate 110, an electrode support (first conductive member) 120, a contactor 130, a current supply actuator (third member) 140, an insulator 150, an annular member (second conductive member) 160, and an upper lid member 170. Further, the electrode plate 110 and the electrode support 120 constitute an upper electrode.

The electrode plate 110 constitutes a facing surface with the substrate support 11 that functions as a lower electrode. Further, the gas introduction ports 13c (see FIG. 1) is formed on the electrode plate 110. The electrode plate 110 is made of, for example, silicon, SiC, or the like.

The electrode support 120 supports the electrode plate 110 in a detachable manner. Further, the gas diffusion chamber 13b (see FIG. 1) is formed in the electrode support 120. The electrode support 120 is made of a conductive material such as aluminum or the like. The electrode plate 110 is disposed on a lower surface of the electrode support 120. Further, an upper portion of the electrode support 120 has a diameter larger than that of the electrode plate 110 and has a surface (first surface) 121 facing the annular member 160.

The contactor 130 made of a conductive material is provided on a side of an upper surface of the electrode support 120. One end of a current feeding rod 131 is connected to the contactor 130. The other end of the current feeding rod 131 is connected to the power supply 30 (the DC power supply 32, the second DC generator 32b). As a result, the power supply 30 applies a voltage or a current (second DC signal) to the electrode support 120 and the electrode plate 110 via the current feeding rod 131 and the contactor 130.

The insulator 150 is made of a non-conductive material such as alumina or the like. The insulator 150 is an annular member and is disposed between the electrode support 120 and the annular member 160.

The annular member 160 is made of a conductive material such as aluminum or the like. The annular member 160 is a substantially cylindrical member and supports the electrode support 120 via the insulator 150. Further, the annular member 160 has a surface (second surface) 161 facing the surface 121 of the electrode support 120.

The upper lid member 170 is made of a conductive material such as aluminum or the like. The upper lid member 170 is electrically connected to the annular member 160. Further, the annular member 160 and the upper lid member 170 are electrically connected to the side wall 10a of the plasma processing chamber 10 and are electrically grounded.

The current supply actuator 140 is a member made of a shape memory alloy (SMA) having a shape that varies by giving a temperature change. The current supply actuator 140 is a shaft-shaped member made of, for example, a Ni—Ti alloy. An axial length of the current supply actuator 140 is reduced when a temperature change is applied to the current supply actuator 140 by applying a voltage or current to the electrode support 120 and the electrode plate 110.

One end of the current supply actuator 140 is fixed to the surface 121 of the electrode support 120.

As shown in FIG. 2, the other end of the current supply actuator 140 is in contact with the surface 161 of the annular member 160 in a state in which no voltage or current is applied from the power supply 30 to the electrode support 120 and the electrode plate 110. As a result, the electrode support 120 and the annular member 160 are electrically connected to each other via the current supply actuator 140. That is, potentials of the electrode support 120 and the electrode plate 110 are in a GND state. In other words, the electrode support 120 and the annular member 160 have the same potential.

On the other hand, as shown in FIG. 3, when a temperature change is given by applying a voltage or current from the power supply 30 to the electrode support 120 and the electrode plate 110, the axial length of the current supply actuator 140 is reduced, and the other end of the current supply actuator 140 is separated from the surface 161 of the annular member 160. As a result, the electric connection between the electrode support 120 and the annular member 160 is released. That is, the potentials of the electrode support 120 and the electrode plate 110 become a floating state. In other words, the electrode support 120 and the annular member 160 have different potentials. By applying a voltage or current from the power supply 30 to the upper electrode support 120 and the electrode plate 110, the current flowing from the electrode support 120 to the annular member 160 via the current supply actuator 140 causes the current supply actuator 140 to generate heat (undergo a temperature change), whereby the axial length of the current supply actuator 140 is reduced, and the electric connection between the electrode support 120 and the annular member 160 is released. Further, plasma is generated in the plasma processing space 10s between the upper electrode (the electrode support 120 and the electrode plate 110) and the lower electrode (the substrate support 11), and the current supply actuator 140 is heated (temperature-changed) by the heat of the plasma, thereby maintaining the state in which the electric connection between the electrode support 120 and the annular member 160 is released.

As described above, according to the upper electrode of the first embodiment, the GND state and the floating state of the electrode support 120 and the electrode plate 110 can be switched by applying a voltage or current (the second DC signal) from the power supply 30 to the electrode support 120 and the electrode plate 110. In other words, the electrical connection and electrical disconnection between the electrode support 120 and the annular member 160 can be switched. That is, the power supply 30 constitutes a control mechanism for switching the electrical connection and electrical disconnection between the electrode support 120 and the annular member 160 by giving a temperature change to the current supply actuator 140.

Further, since the electrical connection and electrical disconnection between the electrode support 120 and the annular member 160 can be switched by applying the voltage or the current from the DC power supply (the power supply 30, the DC power supply 32, the second DC generator 32b) provided in the plasma processing apparatus 1, it is not necessary to separately prepare a power supply for switching the electrical connection and electrical disconnection in the current supply actuator 140. Further, since the current supply actuator 140 can eliminate the need for mechanical drive for switching the electrical connection and electrical disconnection, it is possible to provide a quiet and simple structure. However, a separate power supply (control mechanism) for giving a temperature change to the current supply actuator 140 may be provided.

Although it has been described that the current supply actuator 140 switches the electrical connection between the electrode support 120 and the annular member 160, the present disclosure is not limited thereto.

Figure 4:
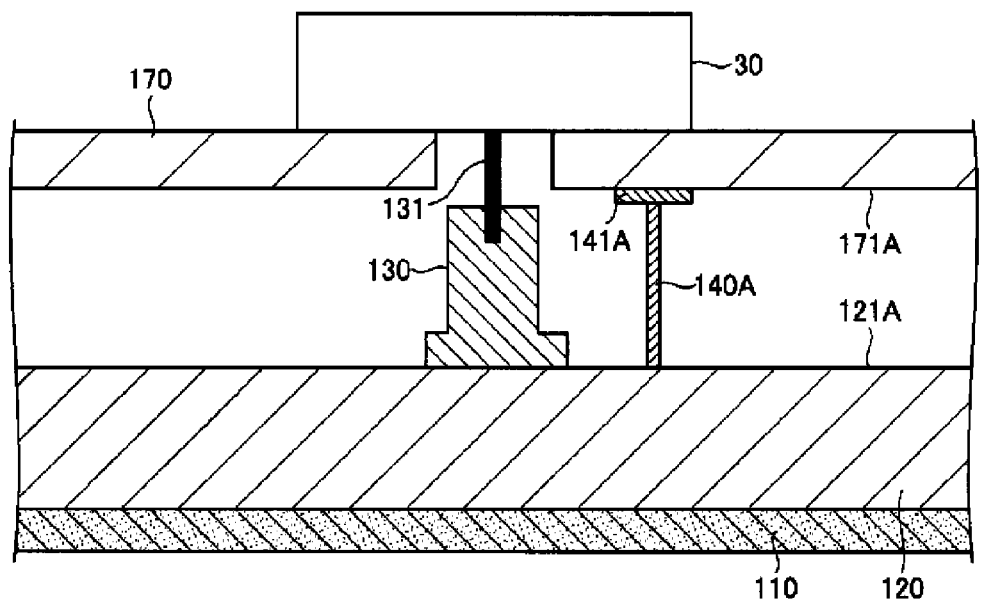
FIG. 4 shows an example of an upper electrode according to a second embodiment when a DC is not applied.
Figure 5:
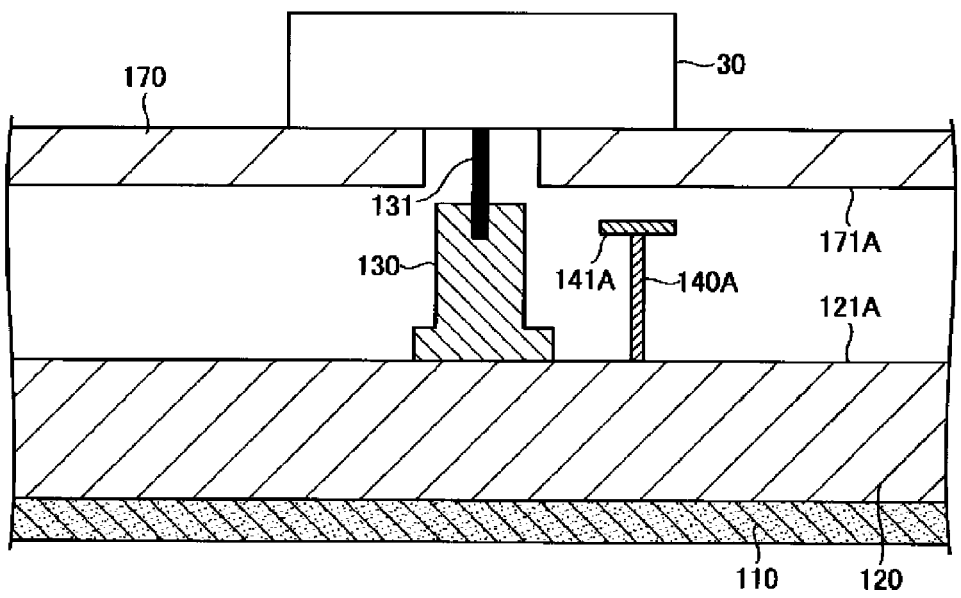
FIG. 5 shows an example of the upper electrode according to the second embodiment when the DC is applied.

Next, another example of the upper electrode (shower head 13) of the plasma processing apparatus 1 will be further described with reference to FIGS. 4 and 5. FIG. 4 shows an example of an upper electrode according to a second embodiment when a DC is not applied. FIG. 5 shows an example of the upper electrode according to the second embodiment when the DC is applied.

The plasma processing apparatus 1 includes an electrode plate 110, an electrode support (first conductive member) 120, a contactor 130, a current supply actuator (third member) 140A, an insulator 150 (not shown in FIGS. 4 and 5), an annular member 160 (not shown in FIGS. 4 and 5), and an upper lid member (second conductive member) 170. Further, the electrode plate 110 and the electrode support 120 constitute an upper electrode.

The electrode support 120 has a surface (first surface) 121A facing the upper lid member (second conductive member) 170. Further, the upper lid member 170 has a surface (second surface) 171A facing the surface 121A of the electrode support 120.

The current supply actuator 140A is a member made of a shape memory alloy (SMA) having a shape that varies by giving a temperature change. The current supply actuator 140A is a shaft-shaped member made of, for example, a Ni—Ti alloy. An axial length of the current supply actuator 140A is reduced when a temperature change is applied to the current supply actuator 140A by applying a voltage or current to the electrode support 120 and the electrode plate 110.

One end of the current supply actuator 140A is fixed to the surface 121A of the electrode support 120. The other end of the current supply actuator 140A is connected to a contact member 141A. The contact member 141A is made of a conductive material such as aluminum or the like.

As shown in FIG. 4, in a state in which no voltage or current is applied from the power supply 30 to the electrode support 120 and the electrode plate 110, the contact member 141A provided at the other end of the current supply actuator 140A is in contact with the surface 171A of the upper lid member 170. As a result, the electrode support 120 and the upper lid member 170 are electrically connected to each other via the current supply actuator 140A and the contact member 141A. That is, potentials of the electrode support 120 and the electrode plate 110 are in a GND state. In other words, the electrode support 120 and the upper lid member 170 have the same potential.

On the other hand, as shown in FIG. 5, when a temperature change is given by applying a voltage or current from the power supply 30 to the electrode support 120 and the electrode plate 110, the axial length of the current supply actuator 140A is reduced, and the contact member 141A provided at the other end of the current supply actuator 140A is separated from the surface 171A of the upper lid member 170. As a result, the electrical connection between the electrode support 120 and the upper lid member 170 is released. That is, the potentials of the electrode support 120 and the electrode plate 110 become a floating state. In other words, the electrode support 120 and the upper lid member 170 have different potentials.

Figure 6:
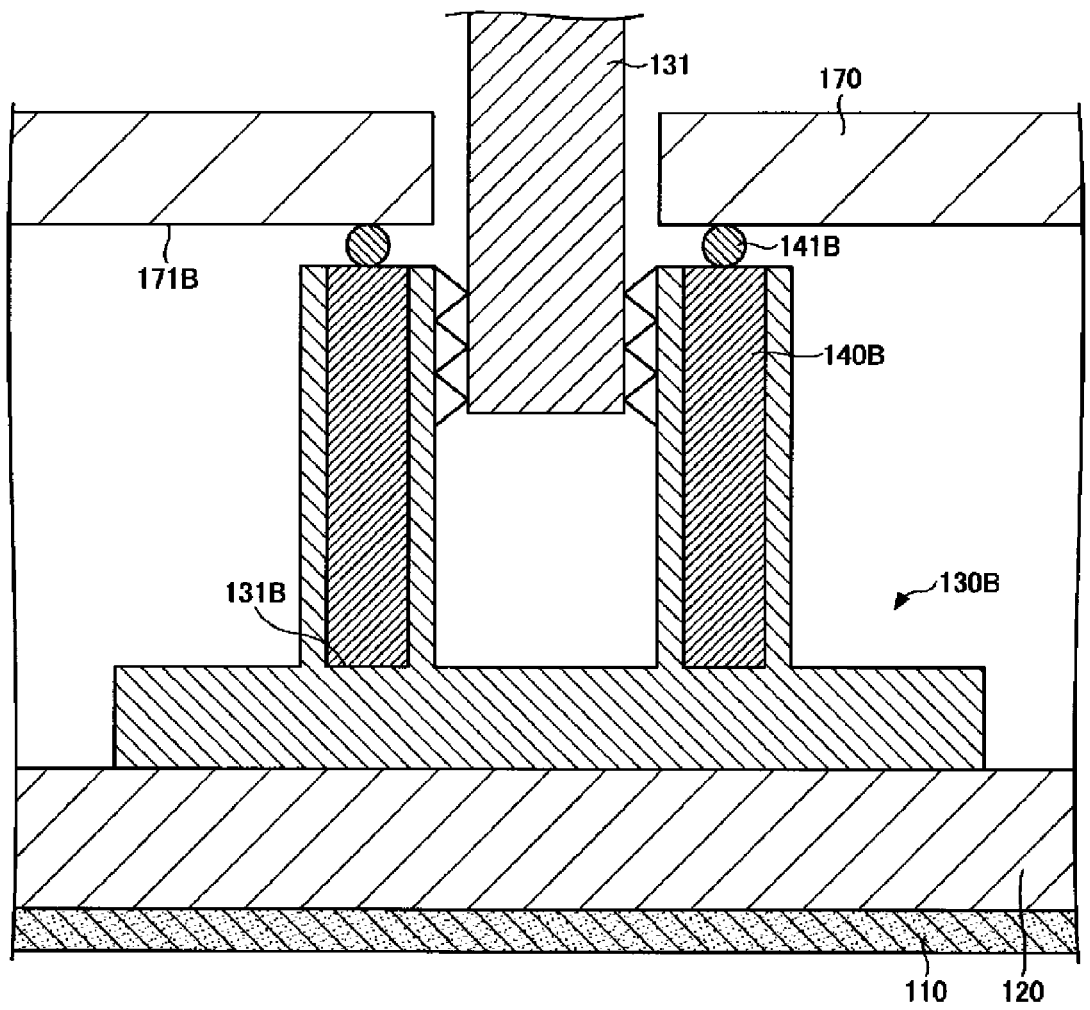
FIG. 6 shows an example of an upper electrode according to a third embodiment when a DC is not applied.

Next, still another example of the upper electrode (shower head 13) of the plasma processing apparatus 1 will be further described with reference to FIG. 6. FIG. 6 shows an example of an upper electrode according to a third embodiment when a DC is not applied.

The plasma processing apparatus 1 includes an electrode plate 110, an electrode support 120, a contactor (first conductive member) 130B, a current supply actuator (third member) 140B, an insulator 150 (not shown in FIG. 6), an annular member 160 (not shown in FIG. 6), and an upper lid member (second conductive member) 170. Further, the electrode plate 110 and the electrode support 120 constitute an upper electrode.

The contactor 130B has a surface (first surface) 131B facing the upper lid member (second conductive member) 170. Further, the upper lid member 170 has a surface (second surface) 171B facing the surface 131B of the contactor 130B.

The current supply actuator 140B is a member made of a shape memory alloy (SMA) having a shape that varies by giving a temperature change. The current supply actuator 140B is, for example, a cylindrical member made of a Ni—Ti alloy. When a voltage or current is applied to the electrode support 120 and the electrode plate 110 to give a temperature change to the current supply actuator 140B, an axial length of the current supply actuator 140B is reduced. The contactor 130B includes a cylindrical portion into which a current feeding rod 131 is inserted, and a flange portion having a diameter larger than the cylindrical portion and connected to the electrode support 120. The cylindrical current supply actuator 140B is accommodated in the cylindrical portion of the contactor 130B.

One end of the current supply actuator 140B is fixed to the surface 131B of the contactor 130B. Further, a conductive gasket 141B is provided on the surface 171B of the upper lid member 170.

As shown in FIG. 6, when no voltage or current is applied from the power supply 30 to the electrode support 120 and the electrode plate 110, the other end of the current supply actuator 140B is in contact with the surface 171B of the upper lid member 170 via the conductive gasket 141B. As a result, the electrode support 120 and the upper lid member 170 are electrically connected to each other via the current supply actuator 140B and the conductive gasket 141B. That is, potentials of the electrode support 120 and the electrode plate 110 are in a GND state. In other words, the electrode support 120 and the upper lid member 170 have the same potential.

On the other hand, when a temperature change is given by applying a voltage or current from the power supply 30 to the electrode support 120 and the electrode plate 110, the axial length of the current supply actuator 140B is reduced, and the other end of the current supply actuator 140B is separated from the conductive gasket 141B (the surface 171B of the upper lid member 170). As a result, the electrical connection between the electrode support 120 and the upper lid member 170 is released. That is, the potentials of the electrode support 120 and the electrode plate 110 become a floating state. In other words, the electrode support 120 and the upper lid member 170 have different potentials.

As described above, according to the upper electrode of the second embodiment (see FIGS. 4 and 5) and the upper electrode of the third embodiment (see FIG. 6), the GND state and the floating state of the electrode support 120 and the electrode plate 110 can be switched by applying a voltage or current (the second DC signal) from the power supply 30 to the electrode support 120 and the electrode plate 110. In other words, the electrical connection and electrical disconnection between the electrode support 120 and the upper lid member 170 can be switched. That is, the power supply 30 constitutes a control mechanism for switching the electrical connection and electrical disconnection between the electrode support 120 and the upper lid member 170 by giving a temperature change to the current supply actuator 140A or 140B.

Further, since the electrical connection and electrical disconnection between the electrode support 120 and the upper lid member 170 can be switched by applying a voltage or current from the DC power supply (the power supply 30, the DC power supply 32, the second DC generator 32b) provided in the plasma processing apparatus 1, it is not necessary to separately prepare a power supply for switching the electrical connection and electrical disconnection in the current supply actuator 140A or 140B. Further, since the current supply actuator 140A or 140B can eliminate the need for mechanical drive for switching the electrical connection and electrical disconnection, it is possible to provide a quiet and simple structure. However, a separate power supply (control mechanism) for giving a temperature change to the current supply actuator 140A or 140B may be provided.

Although the embodiments of the plasma processing system have been described above, the present disclosure is not limited to the above embodiments and the like. Various modifications and improvements may be made within the scope of the gist of the present disclosure recited in the claims.

It has been described that the second conductive member (the annular member 160, the upper lid member 170) is grounded. However, the present disclosure is not limited thereto. The second conductive member may be a reference potential.

It has been described that the current supply actuators 140, 140A, and 140B are composed of a shape memory alloy member. However, the present disclosure is not limited thereto. The current supply actuators 140, 140A, and 140B may be a piezoelectric member, a bimetal member, or the like.

It has been described that the current supply actuators 140, 140A, and 140B switch the electrical connection and electrical disconnection between the electrode support 120 to which a voltage or current is applied from the power supply 30 and the grounded member (the annular member 160 or the upper lid member 170). However, the present disclosure is not limited thereto. For example, the plasma processing apparatus 1 includes the baffle plate 14 provided between the side wall 10a and the substrate support 11 and configured to adjust the gas flow from the plasma processing space 10s to the gas discharge port 10e. Further, voltage or current may be applied from the power supply (not shown) to the baffle plate. The current supply actuator may be provided so as to switch the electrical connection and electrical disconnection between the baffle plate and the side wall 10a. This makes it possible to control an amount of plasma confinement and adjust etching characteristics.

According to the present disclosure in some embodiments, it is possible to provide a plasma processing apparatus capable of switching a potential of a conductive member to which a voltage or current is applied from a power supply.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus, comprising:
a plasma processing chamber;
a first conductive member disposed in the plasma processing chamber and having a first surface;
a second conductive member having a second surface facing the first surface of the first conductive member;
a third member disposed on at least one selected from the group of the first conductive member and the second conductive member and having a shape that varies according to a temperature change of the third member; and
a power supply configured to change a temperature of the third member by applying a voltage or current from the power supply, whereby an axial length of the third member is reduced and electric connection between the first conductive member and the second conductive member is released.

2. The plasma processing apparatus of claim 1, wherein when no voltage or current is applied from the power supply, the first conductive member and the second conductive member are electrically connected to each other.

3. The plasma processing apparatus of claim 2, wherein when the voltage or current is applied to one of the first conductive member and the second conductive member, the other one of the first conductive member and the second conductive member has a reference potential.

4. The plasma processing apparatus of claim 3, wherein the voltage or current is a direct current.

5. The plasma processing apparatus of claim 4, wherein the third member includes at least one of a shape memory alloy member, a piezoelectric member, and a bimetal member.

6. The plasma processing apparatus of claim 5, wherein the first conductive member is an upper electrode, and the second conductive member is a member electrically connected to an outer wall member of the plasma processing chamber.

7. The plasma processing apparatus of claim 2, wherein the voltage or current is a direct current.

8. The plasma processing apparatus of claim 1, wherein the third member includes at least one of a shape memory alloy member, a piezoelectric member, and a bimetal member.

9. The plasma processing apparatus of claim 1, wherein the first conductive member is an upper electrode, and the second conductive member is a member electrically connected to an outer wall member of the plasma processing chamber.

10. The plasma processing apparatus of claim 1, wherein the power supply is a part of a plasma generator and/or a biasing power supply to the first conductive member or the second conductive member.

11. The plasma processing apparatus of claim 1, wherein the power supply is a separate power supply than a plasma generator and/or a biasing power supply to the first conductive member or the second conductive member.

* * * * *